(12) United States Patent
Liang

(10) Patent No.: US 11,004,957 B2
(45) Date of Patent: May 11, 2021

(54) MANUFACTURING METHODS OF INORGANIC THIN FILM TRANSISTORS (TFTS) AND FLEXIBLE DISPLAY DEVICES

(71) Applicant: Wuhan China Star Optoelectronics Technology Co., Ltd., Hubei (CN)

(72) Inventor: Bo Liang, Guangdong (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 39 days.

(21) Appl. No.: 15/540,543

(22) PCT Filed: May 23, 2017

(86) PCT No.: PCT/CN2017/085562
§ 371 (c)(1),
(2) Date: Jun. 28, 2017

(87) PCT Pub. No.: WO2018/196069
PCT Pub. Date: Nov. 1, 2018

(65) Prior Publication Data
US 2018/0315836 A1 Nov. 1, 2018

(30) Foreign Application Priority Data
Apr. 28, 2017 (CN) .......................... 201710296914.0

(51) Int. Cl.
*H01L 29/66* (2006.01)
*H01L 27/12* (2006.01)
(Continued)

(52) U.S. Cl.
CPC .... *H01L 29/66757* (2013.01); *H01L 21/3086* (2013.01); *H01L 27/1218* (2013.01);
(Continued)

(58) Field of Classification Search
CPC ....... H01L 29/66; H01L 29/786; H01L 29/06; H01L 21/304
(Continued)

(56) References Cited

U.S. PATENT DOCUMENTS 5,368,683 A * 11/1994 Altavela ................ B41J 2/1603
216/27
5,376,559 A * 12/1994 Mukai ............... H01L 29/66772
148/DIG. 12
(Continued)

FOREIGN PATENT DOCUMENTS

CN 106129112 A 11/2016

*Primary Examiner* — Sheng-Bai Zhu
(74) *Attorney, Agent, or Firm* — Leong C. Lei

(57) ABSTRACT

The present disclosure relates to a manufacturing method of inorganic thin film transistors (TFTs), including: forming a p-type semiconductor layer and a n-type semiconductor layer on a hard substrate in sequence, forming a slot on the p-type semiconductor layer, wherein the slot passes through the n-type semiconductor layer, forming a source and a drain on the n-type semiconductor layer, wherein the source and the drain are respectively configured on two sides of the slot, performing a flip-transferring process to transfer the p-type semiconductor layer, the n-type semiconductor layer, the source, and the drain on a flexible substrate, forming a gate insulation layer and a gate on the p-type semiconductor layer in sequence, forming a flat layer on the gate insulation layer, wherein the flat layer covers the gate. The inorganic TFT is designed to obtain a narrow channel inorganic TFT device, to reduce process requirements, and to reduce costs.

8 Claims, 3 Drawing Sheets

(51) Int. Cl.
*H01L 29/786* (2006.01)
*H01L 21/308* (2006.01)
*H01L 29/423* (2006.01)
*H01L 21/3065* (2006.01)
*H01L 27/32* (2006.01)

(52) U.S. Cl.
CPC .... *H01L 27/1266* (2013.01); *H01L 29/42384* (2013.01); *H01L 29/78603* (2013.01); *H01L 29/78618* (2013.01); *H01L 29/78696* (2013.01); *H01L 21/3065* (2013.01); *H01L 27/3244* (2013.01); *H01L 27/3262* (2013.01)

(58) Field of Classification Search
USPC .......................................... 257/192; 438/191
See application file for complete search history.

(56) References Cited

U.S. PATENT DOCUMENTS

| | | | |
|---|---|---|---|
| 6,756,289 B1* | 6/2004 | Nakagawa | C30B 19/12 257/E21.115 |
| 2013/0082241 A1* | 4/2013 | Kub | H01L 27/148 257/21 |
| 2013/0099658 A1* | 4/2013 | Tsai | H01L 51/0097 313/504 |
| 2016/0062200 A1 | 3/2016 | Jung | |
| 2017/0098715 A1* | 4/2017 | Ma | H01L 29/78618 |

* cited by examiner

MANUFACTURING METHODS OF INORGANIC THIN FILM TRANSISTORS (TFTS) AND FLEXIBLE DISPLAY DEVICES

BACKGROUND OF THE INVENTION

1. Field of the Invention

The present disclosure relates to display field, more particular to a manufacturing method of inorganic thin film transistor (TFT) and a flexible display device.

2. Discussion of the Related Art

Inorganic thin film transistors (TFTs) have attributes in many aspects of the electrical performance when being compared with organic TFTs. However, adopting the inorganic TFTs may have disadvantages, such as complicated manufacturing process, high costs, and poor device stability. The inorganic TFTs may adopt nano-imprinting technique and transfer-printing technique so as to guarantee higher electron mobility and higher electron saturation velocity, and to provide flexibility and bending stability close to the organic TFTs.

Therefore, it is necessary to provide a manufacturing method of the inorganic TFTs adopting the nano-imprinting technique and transfer-printing technique.

SUMMARY

The present disclosure relates to a manufacturing method of the inorganic TFTs adopting the nano-imprinting technique and transfer-printing technique and a flexible display device.

In an aspect, the present disclosure relates to a manufacturing method of the inorganic TFTs, including: forming a p-type semiconductor layer and a n-type semiconductor layer on a hard substrate in sequence;forming a slot on the p-type semiconductor layer, wherein the slot passes through the n-type semiconductor layer;forming a source and a drain on the n-type semiconductor layer, wherein the source and the drain are respectively configured on two sides of the slot;performing a flip-transferring process to transfer the p-type semiconductor layer, the n-type semiconductor layer, the source, and the drain on a flexible substrate;forming a gate insulation layer and a gate on the p-type semiconductor layer in sequence; forming a flat layer on the gate insulation layer, wherein the flat layer covers the gate.

Wherein the step of forming the p-type semiconductor layer and the n-type semiconductor layer on the hard substrate in sequence further includes: depositing a semiconductor layer on the hard substrate;conducting an ion implantation process, a crystallization process and a thermal annealing process on the semiconductor layer to form the p-type semiconductor layer and the n-type semiconductor layer.

Wherein the step of forming the slot on the p-type semiconductor layer further includes: coating a imprinting photo resist on the n-type semiconductor layer; conducting a hot imprinting process on the imprinting photo resist via an imprinting mold to form at least one through hole on the imprinting photo resist, wherein the n-type semiconductor layer is exposed by the through hole; etching the exposed n-type semiconductor layer and etching the p-type semiconductor layer to form the slot; removing the remaining imprinting photo resist.

Wherein a dry etching process is applied to the exposed n-type semiconductor layer and the p-type semiconductor layer.

Wherein an adhesive layer is formed on the flexible substrate before the flip-transferring process;the adhesive layer fills up between the source and the flexible substrate, between the drain and the flexible substrate, between the n-type semiconductor layer and the flexible substrate, and the slot after the flip-transferring process.

Wherein the hard substrate is a glass substrate.

Wherein the flexible substrate is made of at least one of ethylene terephthalate, polyethylene naphthalate, and polyimide.

In another aspect, the present disclosure relates to a flexible display device manufactured by the manufacturing method as claimed above.

Wherein the flexible display device is an organic electroluminescent display device.

In view of the above, the inorganic TFT manufactured by the nano-imprinting process may be suitable for the manufacturing process of the flexible display device and may have great electrical performance. The structure of the inorganic TFT is designed so as to obtain a narrow channel inorganic TFT device, to reduce process requirements, and to reduce costs. In addition, the inorganic TFT may be transferred to the flexible substrate in a large scale, which is suitable for the inorganic TFTs of the flexible display device being manufactured in a large scale.

DETAILED DESCRIPTION OF THE EMBODIMENTS

Figure 1A:
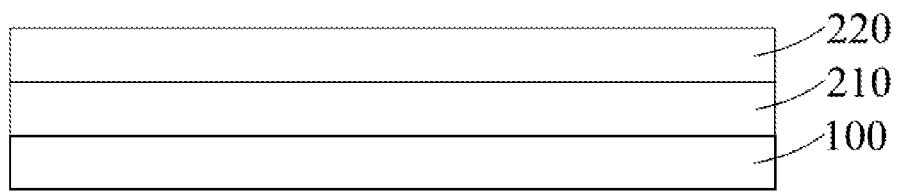
FIGS. 1A to 1F are schematic views of a manufacturing method of inorganic TFTs in accordance with one embodiment in the present disclosure.

Following embodiments of the invention will now be described in detail hereinafter with reference to the accompanying drawings. However, there are plenty of forms to implement the present disclosure, and the invention should not be construed as limitation to the embodiments. Rather, these embodiments are provided to explain the principles of the invention and its practical application, thereby enabling other person skilled in the art to understand each of the embodiments in the invention and various modifications being suitable for the particular application.

In the drawings, the thicknesses of layers and regions may be exaggerated for clarity. Same reference numerals refer to the same components throughout the specification and the drawings.

It will be understood that when an element such as a layer, a film, a region, or a substrate is referred to as being "on" other element, the element may be directly on the other element, or an intermediate element may also be presented in between. Optionally, there is no intermediate element when the element is referred to as being "directly" on the other element.

FIGS. 1A to 1F are schematic views of a manufacturing method of inorganic thin film transistors (TFTs) in accordance with one embodiment in the present disclosure. It is note that the inorganic TFTs in the present disclosure may be perfectly suitable for flexible display device, such as a flexible organic electroluminescent display device.

The present disclosure relates to a manufacturing method of inorganic thin film transistors, including the following steps.

In step 1: referring to FIG. 1A, forming a p-type semiconductor layer 210 and a n-type semiconductor layer 220 on a hard substrate 100 in sequence.

The hard substrate 100 may be made of glass, ceramic, or metal. In one example, the hard substrate 100 in the present disclosure is made of glass.

The step of forming a p-type semiconductor layer 210 and the n-type semiconductor layer 220 on the hard substrate 100 in sequence further includes: depositing a semiconductor layer on the hard substrate 100.

A chemical vapor deposition (CVP) may be conducted to form a silicon (Si) layer, i.e., the semiconductor layer, on the hard substrate 100.

An ion implantation (IMP) process, a crystallization process and a thermal annealing process are conducted on the semiconductor layer to form the p-type semiconductor layer 210 and the n-type semiconductor layer 200.

Figure 1B:
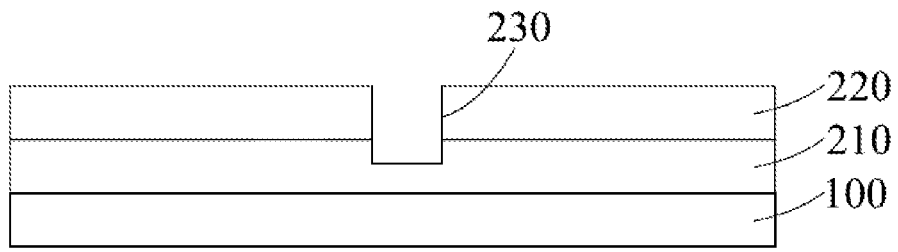

In step 2: referring to FIG. 1B, forming a slot 230 on the p-type semiconductor layer 210, wherein the slot passes through the n-type semiconductor layer 220.

FIGS. 2A to 2D are schematic views showing a formation of the slot in accordance with one embodiment in the present disclosure.

Figure 2A:
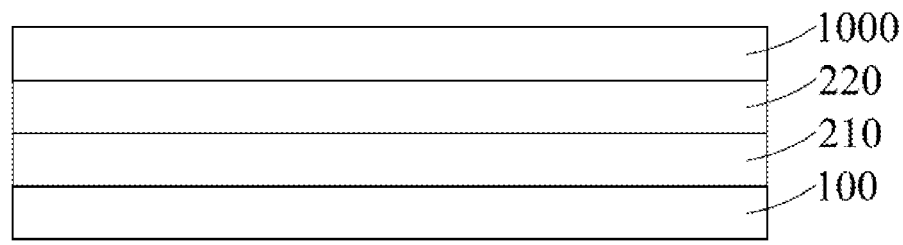
FIGS. 2A to 2D are schematic views showing a formation of a slot in accordance with one embodiment in the present disclosure.
Figure 2B:
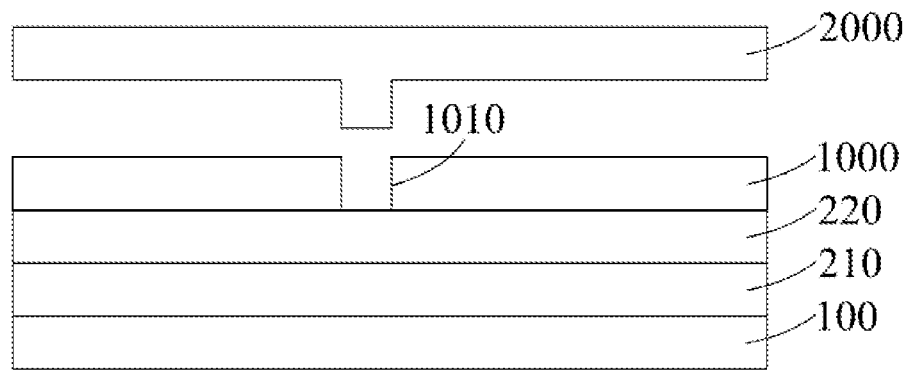
Figure 2C:
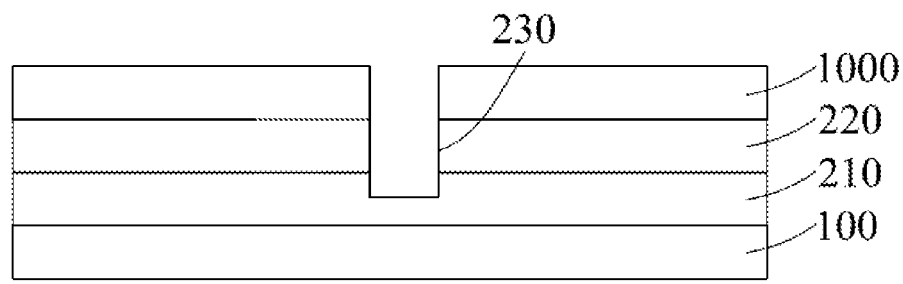
Figure 2D:
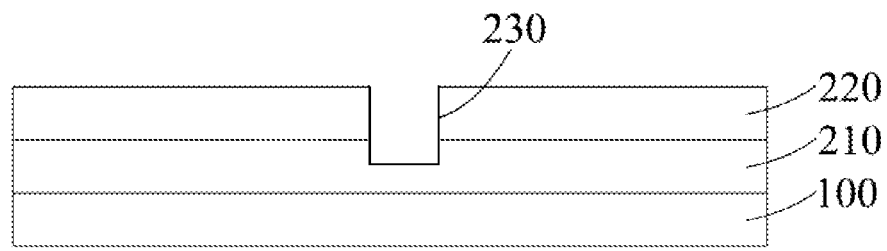

The step of forming the slot 230 on the p-type semiconductor layer 210 further includes: as shown in FIG. 2A, coating a imprinting photo resist 1000 on the n-type semiconductor layer 220, as shown in FIG. 2B, conducting a hot imprinting process on the imprinting photo resist 1000 via an imprinting mold 2000 to form at least one through hole 1010 on the imprinting photo resist 1000, wherein the n-type semiconductor layer 220 is exposed by the through hole 1010, as shown in FIG. 2C, etching the exposed n-type semiconductor layer 220 and etching the p-type semiconductor layer 210 to form the slot 230, as shown in FIG. 2D, removing the remaining imprinting photo resist 1000.

Wherein a dry etching process is applied to the exposed n-type semiconductor layer 220 and the p-type semiconductor layer 210

Figure 1C:
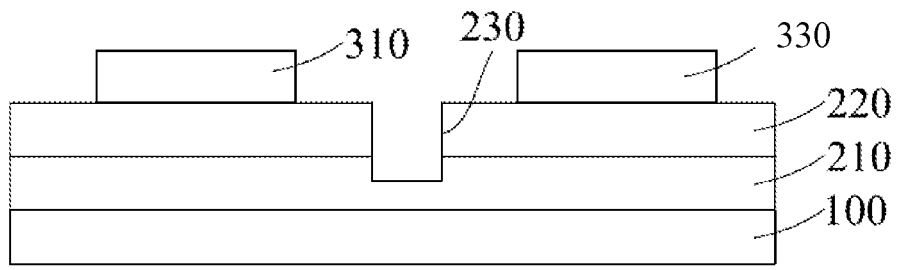

In step 3: referring to FIG. 1C, forming a source 310 and a drain 330 on the n-type semiconductor layer 220, wherein the source 310 and the drain 320 are respectively configured on two sides of the slot 230.

Figure 1D:
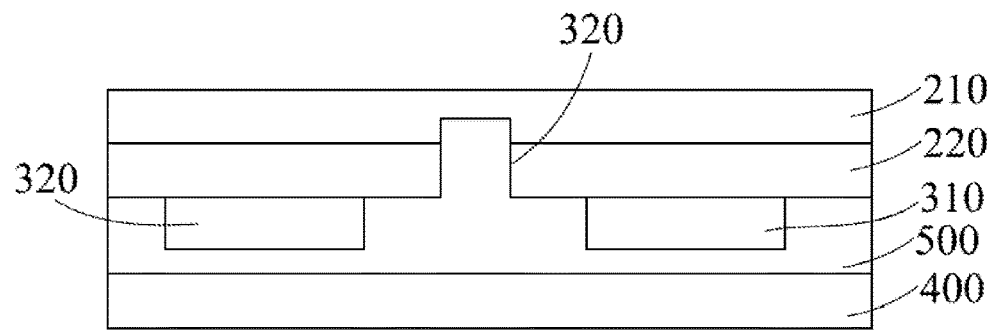

In step 4: referring to FIG. 1D, performing a flip-transferring process to transfer the p-type semiconductor layer 210, the n-type semiconductor layer 220, the source 310, and the drain 330 on a flexible substrate 400.

Wherein an adhesive layer 500 is formed on the flexible substrate 400 before the flip-transferring process. The adhesive layer 500 fills up between the source 310 and the flexible substrate 400, between the drain 330 and the flexible substrate 400, between the n-type semiconductor layer 220 and the flexible substrate 400, and the slot 230 after the flip-transferring process.

In one example, the adhesive layer 500 may not be configured in the present disclosure so as to simplify the manufacturing process.

The flexible substrate 400 is made of at least one of ethylene terephthalate, polyethylene naphthalate, and polyimide.

Figure 1E:
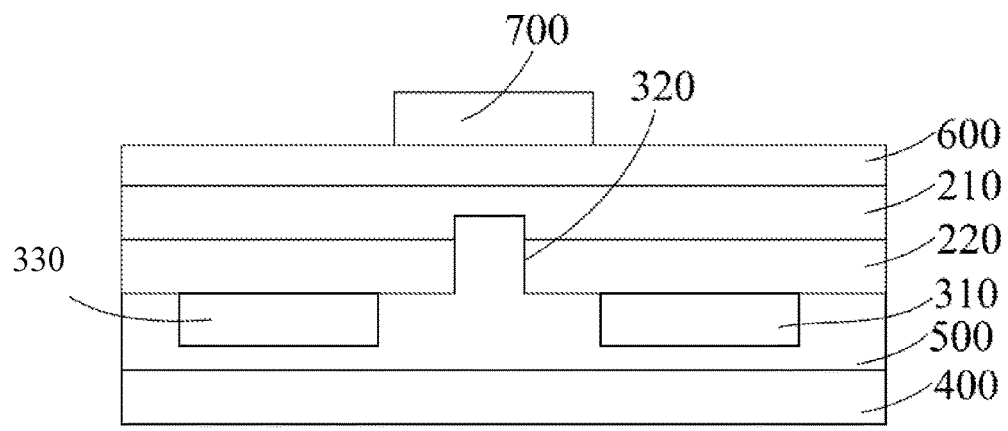

In step 5: referring to FIG. 1E, forming a gate insulation layer 600 and a gate 700 on the p-type semiconductor layer 210 in sequence.

A patterned process may be conducted on the p-type semiconductor layer 210 to obtain an active layer before forming the gate insulation layer 600 and the gate 700.

Figure 1F:
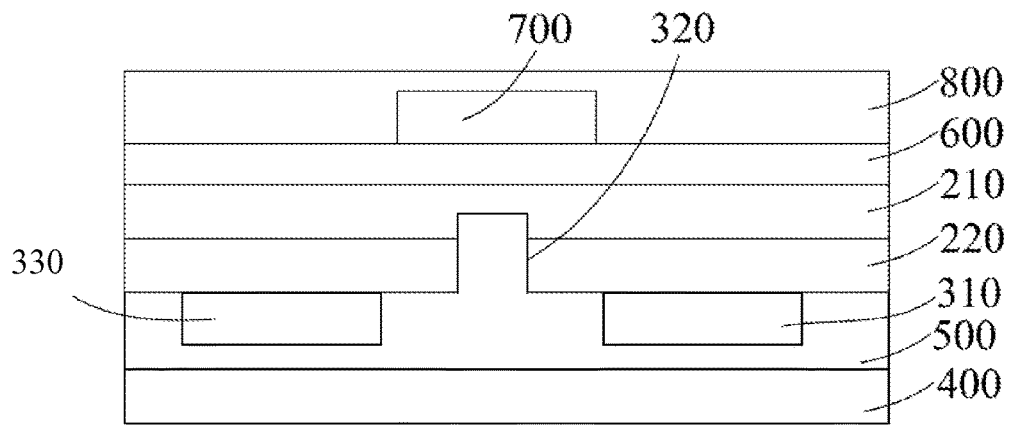

In step 6: referring to FIG. 1F, forming a flat layer 800 on the gate insulation layer 600, wherein the flat layer 800 covers the gate 700.

In view of the above, the inorganic TFT manufactured by the nano-imprinting process may be suitable for the manufacturing process of the flexible display device and may have great electrical performance. The structure of the inorganic TFT is designed so as to obtain a narrow channel inorganic TFT device, to reduce process requirements, and to reduce costs. In addition, the inorganic TFT may be transferred to the flexible substrate in a large scale, which is suitable for the inorganic TFTs of the flexible display device being manufactured in a large scale.

It is believed that the present disclosure is fully described by the embodiments, however, certain improvements and modifications may be made by those skilled in the art without departing from the principles of the present application, and such improvements and modifications shall be regarded as the scope of the present application.

What is claimed is:

1. A manufacturing method of inorganic thin film transistors (TFTs), comprising:

forming a p-type semiconductor layer and a n-type semiconductor layer on a hard substrate in sequence;

forming a slot on the p-type semiconductor layer, wherein the slot passes through the n-type semiconductor layer;

forming a source and a drain on the n-type semiconductor layer, wherein the source and the drain are respectively configured on two sides of the slot;

forming an adhesive layer on a flexible substrate;

performing a flip-transferring process to transfer the p-type semiconductor layer, the n-type semiconductor layer, the source, and the drain on a flexible substrate;

forming a gate insulation layer and a gate on the p-type semiconductor layer in sequence, wherein the gap insulation layer covers a portion of the source and the drain;

forming a flat layer on the gate insulation layer, wherein the flat layer covers the gate; and wherein the adhesive layer fills up between the source and the flexible substrate, the adhesive layer fills up between the drain and the flexible substrate, the adhesive layer fills up between the n-type semiconductor layer and the flexible substrate, and the adhesive layer fills up the slot after the flip-transferring process;

wherein the p-type semiconductor layer is directly formed on a surface of the hard substrate and the p-type semiconductor layer is kept in direct contact with the surface of the hard substrate before the p-type semiconductor layer and the n-type semiconductor layer are transferred to the flexible substrate in the flip-transferring process such that a combination of the p-type semiconductor, the n-type semiconductor, the source and the drain are kept on the surface of the hard substrate before the combination is transferred to the flexible substrate in the flip-transferring process, and wherein the gate insulation layer and the gate are formed on a surface of the p-type semiconductor layer that is exposed through removal of the hard layer after the flip-transferring process that transfers the combination of the p-type semiconductor layer, the n-type semiconductor layer, the source, and the drain to the flexible substrate.

2. The manufacturing method according to claim 1, wherein the step of forming the p-type semiconductor layer and the n-type semiconductor layer on the hard substrate in sequence further comprises:

depositing a semiconductor layer on the hard substrate;

conducting an ion implantation process, a crystallization process and a thermal annealing process on the semiconductor layer to form the p-type semiconductor layer and the n-type semiconductor layer.

3. The manufacturing method according to claim 1, wherein the step of forming the slot on the p-type semiconductor layer further comprises:

coating a imprinting photo resist on the n-type semiconductor layer;

conducting a hot imprinting process on the imprinting photo resist via an imprinting mold to form at least one through hole on the imprinting photo resist, wherein the n-type semiconductor layer is exposed by the through hole;

etching the exposed n-type semiconductor layer and etching the p-type semiconductor layer to form the slot;

removing the remaining imprinting photo resist.

4. The manufacturing method according to claim 3, wherein a dry etching process is applied to the exposed n-type semiconductor layer and the p-type semiconductor layer.

5. The manufacturing method according to claim 1, wherein the hard substrate is a glass substrate.

6. The manufacturing method according to claim 1, wherein the flexible substrate is made of at least one of ethylene terephthalate, polyethylene naphthalate, and polyimide.

7. A flexible display device manufactured by the manufacturing method as claimed in claim 1.

8. The flexible display device according to claim 7, wherein the flexible display device is an organic electroluminescent display device.

* * * * *